(12) United States Patent
Chow et al.

(10) Patent No.: US 6,187,134 B1
(45) Date of Patent: Feb. 13, 2001

(54) REUSABLE WAFER SUPPORT FOR SEMICONDUCTOR PROCESSING

(75) Inventors: Eugene M. Chow, Mountain View; William E. Martin, Cupertino; Chris Storment, Sonoma; Albert Armes, Redwood City, all of CA (US)

(73) Assignee: The Board of Trustees of the LeLand Stanford Junior University, Palo Alto, CA (US)

( * ) Notice: Under 35 U.S.C. 154(b), the term of this patent shall be extended for 0 days.

(21) Appl. No.: 09/351,407

(22) Filed: Jul. 9, 1999

(51) Int. Cl.[7] .................................................. H01L 21/00
(52) U.S. Cl. ............................. 156/345; 438/716
(58) Field of Search ...................... 156/345 P, 345 PW, 156/345 WH; 438/716

(56) References Cited

U.S. PATENT DOCUMENTS

| | | | |
|---|---|---|---|
| 4,213,698 | 7/1980 | Firtion et al. | 355/77 |
| 4,473,455 | * 9/1984 | Dean et al. | 156/345 X |
| 4,646,418 | 3/1987 | Hattori | 29/559 |
| 4,846,452 | 7/1989 | Geneczko | 269/21 |
| 5,033,538 | 7/1991 | Wagner et al. | 165/80.1 |
| 5,180,000 | 1/1993 | Wagner et al. | 165/80.1 |
| 5,324,012 | 6/1994 | Aoyama et al. | 269/21 |
| 5,330,607 | * 7/1994 | Nowicki | 156/345 |
| 5,376,180 | * 12/1994 | Mahler | 156/345 X |

* cited by examiner

*Primary Examiner*—William Powell
(74) *Attorney, Agent, or Firm*—Lumen Intellectual Property Services (57) ABSTRACT

A wafer holding device supports a wafer during semiconductor processing. The device has a planar disk member with a raised supporting edge on which the wafer sits. Cooling gas passes through an aperture in the disk member to contact the bottom surface of the wafer. An O-ring, which sits on or near the raised supporting edge, is used to maintain an airtight seal between the wafer and the wafer holding device. Pegs or a ridge on the supporting edge fix the rotational position of the wafer. The wafer is secured to the device using a ring member, with holes for the ridge or pegs, placed on top of the wafer. At the bottom of the disk member is an annular projection that is held by a robotic transfer mechanism during transport into the process chamber. The projection fits processing equipment designed to hold standard-sized wafers.

26 Claims, 7 Drawing Sheets

REUSABLE WAFER SUPPORT FOR SEMICONDUCTOR PROCESSING

FIELD OF THE INVENTION

This invention relates generally to a support for holding and transporting silicon wafers in a vacuum chamber during semiconductor processing. More particularly, it relates to a support used during very deep or through-wafer etching.

BACKGROUND ART

Semiconductor wafers are a fundamental component of the electronic industry, and improving the quality and efficiency of their processing is, therefore, highly desirable. Wafers are processed in sealed vacuum chambers, where they are supported in a processing machine by a chuck, through which cooling gas flows to contact the bottom surface of the wafer. The wafer, therefore, has a different pressure environment on its top and bottom surfaces.

For procedures in which holes are etched nearly or completely through the wafer, termed very deep to through-wafer etching, the etch must be stopped before it reaches the chuck. Holes that reach the bottom of the wafer expose the chuck to the process environment, damaging the chuck and contaminating the chamber. To prevent this, a thin film layer is placed on the bottom surface of the wafer to stop the etch. This solution causes further problems, because the thin film sticks to the chuck when heated. The thin films used also do not adequately support the wafer structure during and after very deep to through-wafer etching, causing wafers to cleave or shatter during processing.

An additional constraint introduced by very deep to through-wafer etching arises during removal of the wafer from the chuck. Typically, pins rise out of the chuck to lift the wafer and a spatula reaches underneath the wafer to move it out of the process chamber. Deep holes are problematic if they are in the path of the pins or if they significantly decrease the wafer's structural integrity.

A current solution is to use a backing wafer adhered to the process wafer with a thin film, for example photoresist, sandwiched between the two wafers. The backing wafer system, however, introduces further problems. Physical pressure on the process wafer and elevated temperatures are needed to effect adhesion, complicating processing and introducing significant potential for contamination. When the wafer is inserted into the processing chamber, air bubbles between the process and backing wafers, poor quality adhesion, or delaminating of the process wafer at high temperatures cause the wafers to break violently. Wafer breakage is a catastrophic and costly event, requiring operators to shut down and clean the process equipment.

What is needed is a device, such as a wafer holder, that can be used to protect the chuck and support the substrate during through-wafer etching without using a backing wafer.

Existing wafer holders are not designed for very deep to through-wafer etching and do not address all of the requirements outlined above. In general they are fixed to the chuck and themselves need to be protected from contamination by the process environment.

In U.S. Pat. No. 4,213,698, Firtion et al. disclose an apparatus for holding a workpiece during semiconductor processing. Their device creates a planar holding face on the ends of many closely-spaced pins. The apparatus is not applicable for very deep to through-wafer etching and does not allow for cooling gas flow through the device to the wafer.

Hattori describes a substrate carrier in U.S. Pat. No. 4,646,418. The carrier is designed to minimize operator handling of the substrate and is not used during processing.

A workpiece carrier for heat transfer under vacuum conditions is described by Wagner et al. in U.S. Pat. Nos. 5,033,538 and 5,180,000. The carrier contains a complex system of channels and grooves through which a heat transfer gas flows. The channel system is highly complicated, and the carrier is not suitable for through-wafer etching.

Finally, in U.S. Pat. No. 4,846,452 Geneczko discloses a rotational chuck assembly for finely controlling the rotational position of a wafer on a chuck. The assembly is very mechanically complicated, and is actually part of a chuck, not a separate wafer support used to protect a chuck.

OBJECTS AND ADVANTAGES

Accordingly, it is a primary object of the present invention to provide a wafer holding device for transporting a wafer into and out of a processing chamber. An advantage of this device is that it supports the substrate and protects the chuck and process chamber from damage from wafer chips and sticky material on the wafer's bottom surface. An additional advantage of the present invention is the ease with which it is loaded and unloaded from the chuck, compared with a wafer with many deep holes.

It is a further object of the invention to provide a wafer holder that is reusable.

It is an additional object of the invention to provide a means for positioning the wafer in a predetermined orientation in the process chamber, facilitating repeatable processing.

Another object of the present invention is to provide a wafer holder that is compatible with existing processing equipment designed to hold and transport a wafer without a support. Specifically, the present invention fits into a robotic arm and into a chuck.

Allowing for efficient wafer cooling is a further object of the present invention. When a backing wafer is used, the process wafer is cooled through the backing wafer. An advantage of the present invention is that the process wafer is separated from the cooling gas by only the thin film layer.

Another object of the present invention is to accommodate wafers of any size and shape.

Finally, the present invention accomplishes these objects without significant additional wafer handling or processing steps.

SUMMARY

The present invention provides a supporting device for holding, supporting, and transporting wafers in a processing chamber during semiconductor processing. In the preferred embodiment, the size and shape of the device are such that it holds a standard silicon wafer. The device is supported by the processing chuck in a position usually occupied by the wafer itself. To withstand the processing environment, the device, except for the deformable material to be described later, can be fabricated of metal. The invention also provides for a wafer-processing system incorporating the holding device.

The device includes a base, preferably disk shaped, with top and bottom surfaces and a perimeter edge. The bottom surface of the wafer is supported by the base. In one embodiment of the invention, the base contains an aperture through its top and bottom surfaces, preferably passing through the center of the base. Cooling gas flows from the chuck through the aperture to contact the bottom surface of the wafer.

A continuous, raised supporting edge at the perimeter of the base creates a recession well from the top surface of the base and the inner wall of the supporting edge. The wafer sits on this raised edge, allowing the cooling gas to flow through the aperture into the recession well. In the preferred embodiment, the edge has a planar top surface parallel to the top surface of the base.

On or near the raised edge is a resilient, deformable material used to maintain an airtight seal between the wafer and the wafer holding device to isolate the cooling gas from the processing environment. In the preferred embodiment, this material is an O-ring. The O-ring can be placed in an O-ring groove on the planar top surface of the edge or, preferably, inside the recession well, contacting the inner wall of the edge.

The device also contains a means for positioning the wafer in a predetermined position on the raised edge. This can include, but is not limited to, at least three pegs or a raised ridge at the perimeter of the raised supporting edge. The pegs or ridge contact the flat portion and at least part of the curved portion of the wafer edge to fix its position.

A portion of the device is held by a robotic transfer mechanism for transporting the device into and out of the processing chamber and for positioning the device on the chuck. This portion can be an annular protrusion on the bottom surface of the base. In the preferred embodiment, the annular protrusion is shaped like a standard wafer to fit into a mechanical arm designed to move wafers.

Finally, the device contains a means for securing the wafer to the base. A ring member with a hole, preferably centrally located, is placed over the device and rests on the wafer. In the preferred embodiment, the ring member is annular and has a ridge at the circumference of its bottom edge for fitting around the edge of the base. As necessary, the ring member contains holes to accommodate the pegs or other means for positioning the wafer.

The holding device is incorporated into a standard wafer-processing system. Inside a vacuum processing chamber are a processing tool, a chuck containing cooling gas flow channels, and a robotic mechanism for transporting the holding device into the chamber and positioning it on the chuck. The system also contains means for creating and maintaining the vacuum and means for controlling the cooling gas flow in the chuck. The robotic mechanism contains an arm designed to fit standard silicon wafers, but in this system it fits the holding portion of the device. The device is secured to the chuck either electrostatically or mechanically. With electrostatic clamping, the wafer, ring member, and base are held together using screws or clamps. Alternately, mechanical clamps used currently hold the wafer on the device and also the device on the chuck.

DETAILED DESCRIPTION

Figure 1A:
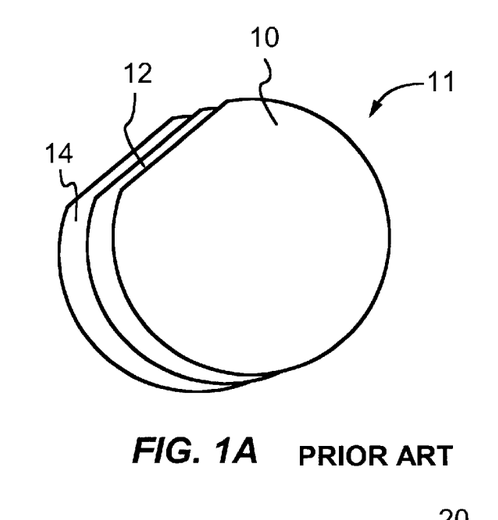
FIG. 1A is a top perspective view of the backing wafer system of the prior art.
Figure 1B:
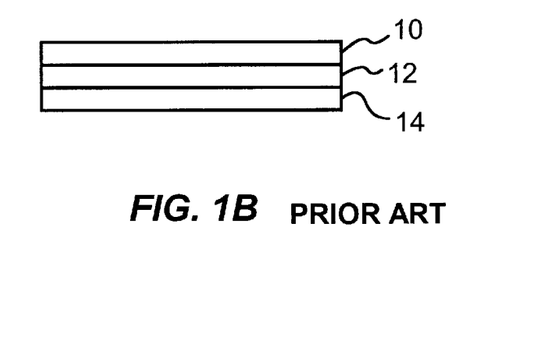
FIG. 1B is a side view of the backing wafer system of FIG. 1A.
Figure 2:
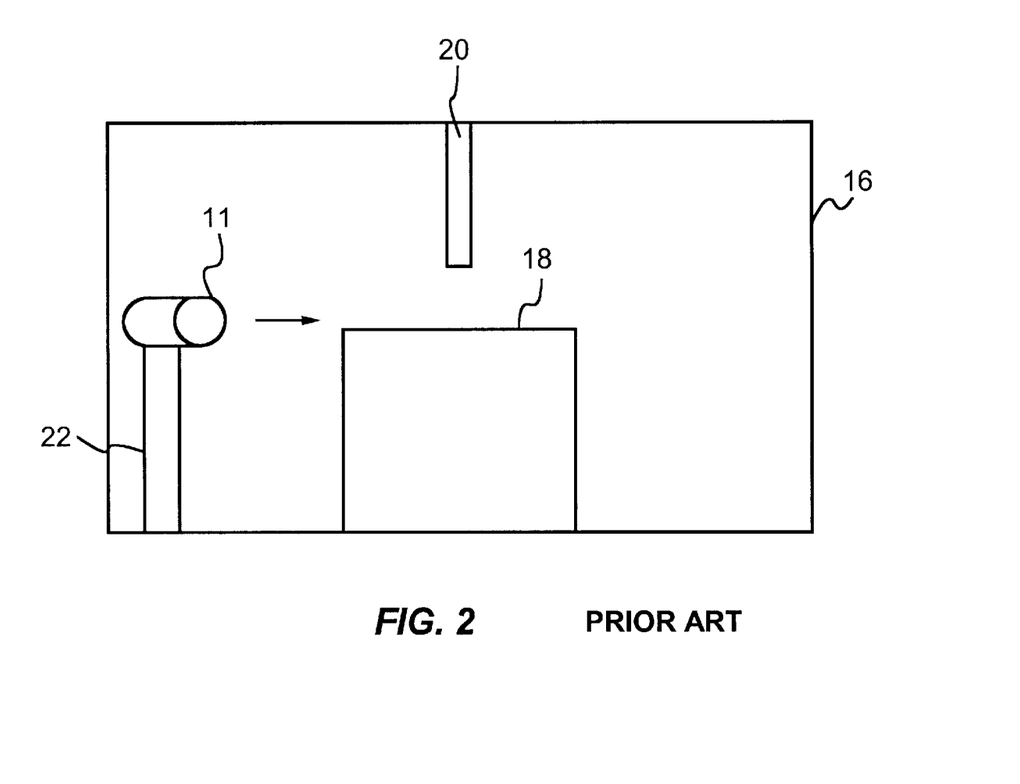
FIG. 2 is a front schematic of the prior art wafer-processing system using the backing wafer system of FIG. 1.

FIGS. 1A and 1B show a backing wafer system 11 used in the prior art. A wafer 10 is bound to a backing wafer 14 by a thin film 12, which is usually photoresist. A wafer-processing system of the prior art, shown in FIG. 2, contains a process chamber 16, a processing tool 20, a chuck 18, and robotic transfer means 22. Robotic transfer means 22 hold and transport backing wafer system 11 and position it on chuck 18 for processing.

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 3A:
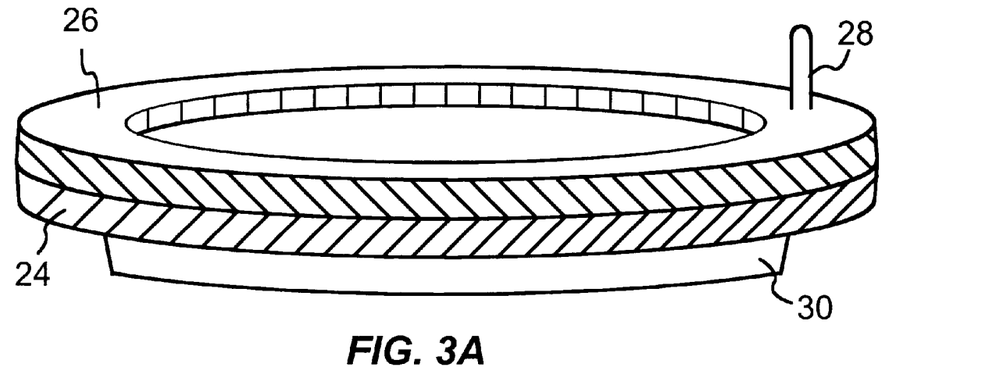
FIG. 3A is a top perspective view of a wafer holding device.
Figure 3B:
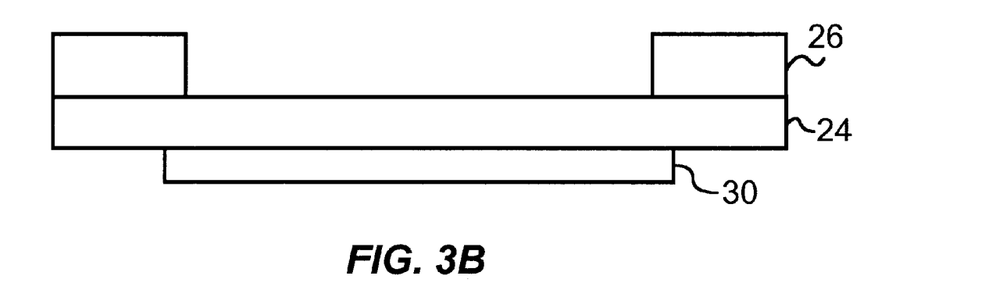
FIG. 3B is a cross-sectional view of the device of FIG. 3A.
Figure 3C:
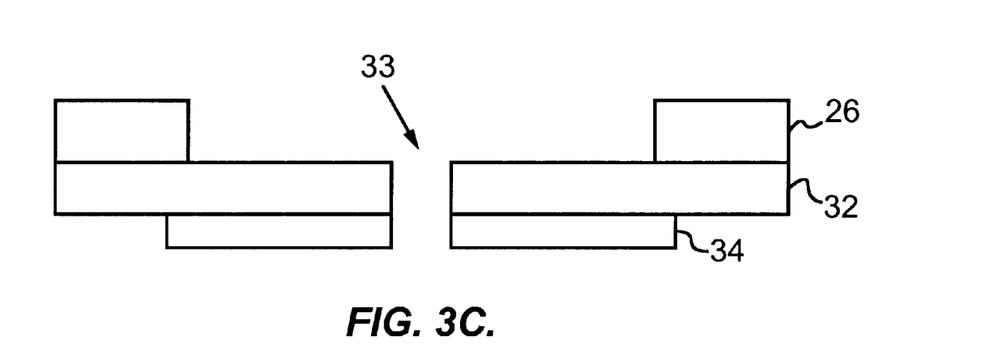
FIG. 3C is an alternate embodiment of the device of FIG. 3B.

The main features of the invention are shown in FIGS. 3A–C. A disk member 24 contains a raised supporting edge 26 for supporting a wafer, a holding portion 30 that is held by robotic transfer means 22 of FIG. 2, and means for positioning the wafer 28. In FIG. 3A, positioning means 28 is shown as a pin for aligning with a known point on the wafer. In FIG. 3C, the device has an aperture 33 extending through a disk member 32 and a holding portion 34. A cooling gas flows through aperture 33 from below holding portion 34 to reach the bottom surface of the wafer.

Figure 4A:
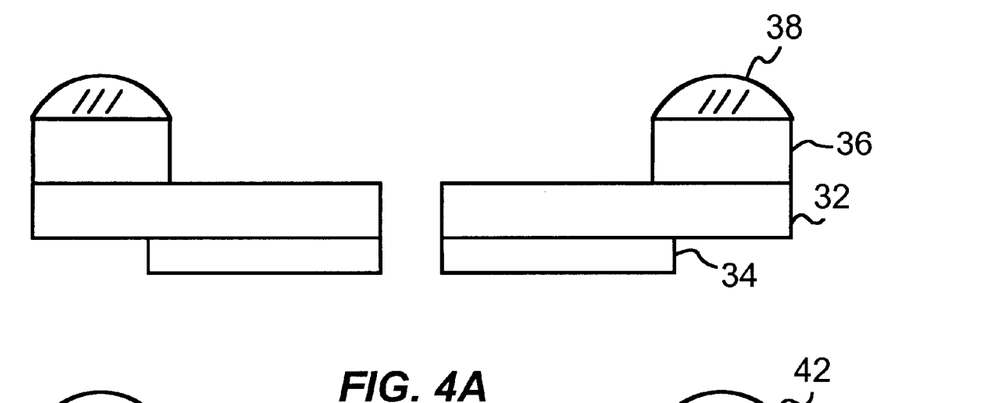
FIGS. 4A–C are cross-sectional views of alternate embodiments of the device with resilient material.
Figure 4B:
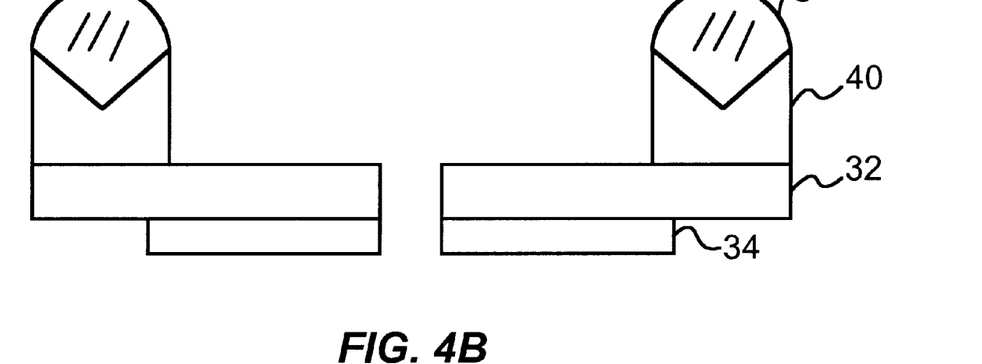
Figure 4C:
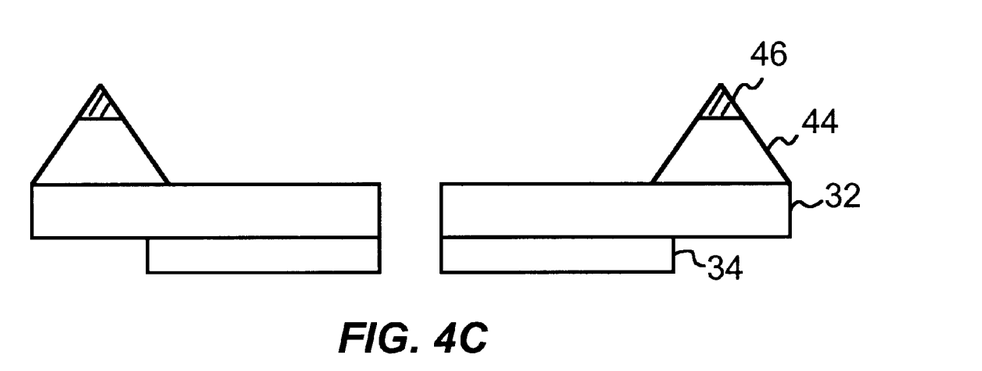

In general, the device is used with a cooling gas and aperture 33, in which case it includes a means for maintaining an airtight seal between the holding device and the. wafer. Alternate embodiments of a raised supporting edge 36, 40, and 44 of different shapes and of correspondingly shaped deformable materials 38, 42, and 46 are shown in FIGS. 4A–C.

A preferred embodiment of the invention is shown in FIGS. 5A–D. The wafer is supported by a planar top surface 56 of raised supporting edge 36. An O-ring 52 rests on the top surface of disk member 32 and contacts an inner wall 50 of raised supporting edge 36. When the wafer is secured to planar top surface 56 and O-ring 52 is compressed, an airtight seal between the wafer and the device is created.

An annular protrusion 57, the preferred embodiment of holding portion 34 shown in FIG. 3C, depends from the bottom surface of disk member 32. In the most preferred embodiment, annular protrusion 57 is the size of a standard silicon wafer, for fitting robotic transfer means 22, shown in FIG. 2.

Figure 5A:
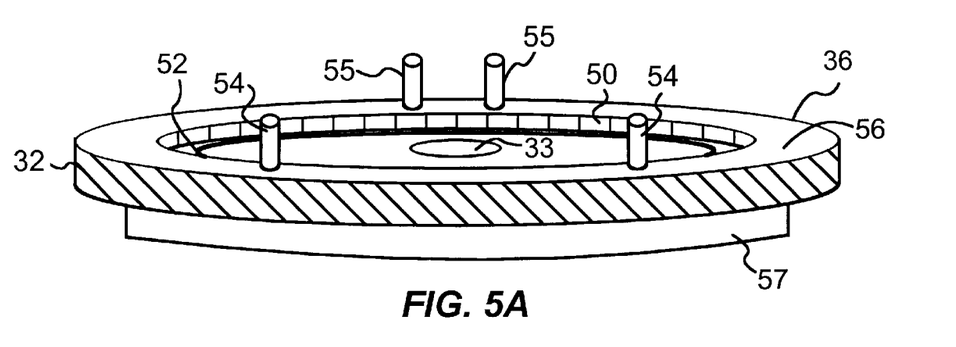
FIG. 5A is a top perspective view of a wafer holding device in accordance with the preferred embodiment of the invention.
Figure 5B:
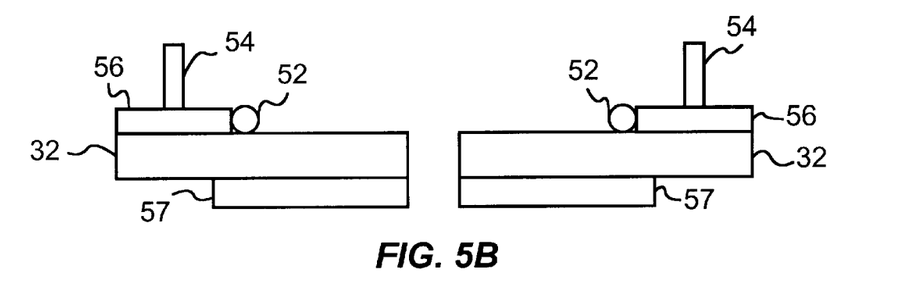
FIG. 5B is a cross-sectional view of the device of FIG. 5A.
Figure 5C:
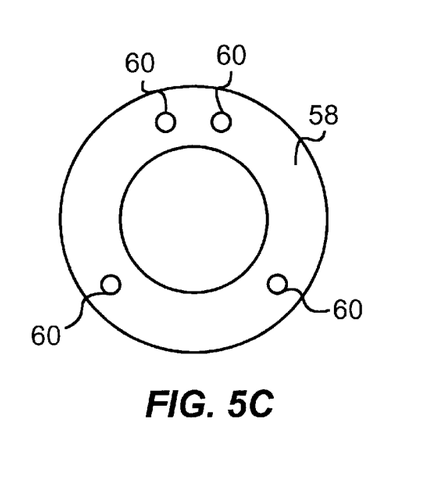
FIG. 5C is a top plan view of an annular ring placed on top of the wafer holding device of FIG. 5A.
Figure 5D:
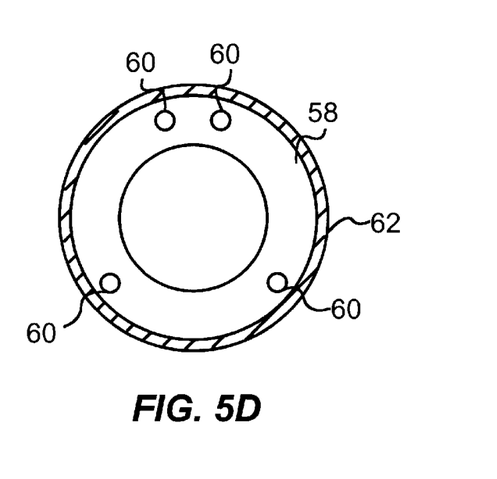
FIG. 5D is a bottom plan view of the annular ring of FIG. 5C.

Pegs 54 and 55 position the wafer with its flat portion against pegs 55. Only one rotational orientation of the wafer is permitted by the arrangement of pegs 54 and 55. To secure the wafer to disk member 32, an annular ring 58, shown in top and bottom views in FIGS. 5C and 5D, respectively, is placed over the wafer. Annular ring 58 has holes 60 for fitting over pegs 54 and 55 and a raised rim 62 on its bottom surface for fitting around disk member 32.

Figure 6A:
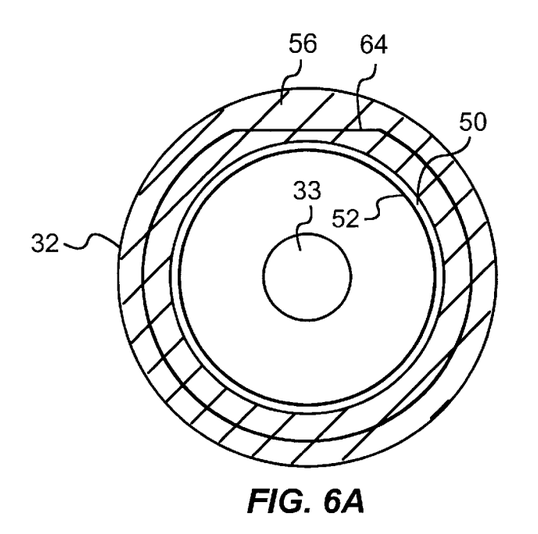
FIG. 6A is a top plan view of a second embodiment of the invention.
Figure 6B:
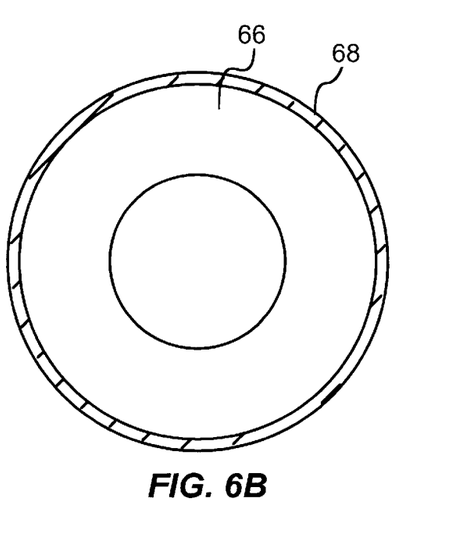
FIG. 6B is a bottom plan view of an annular ring placed on top of the wafer supporting device of FIG. 6A.
Figure 7A:
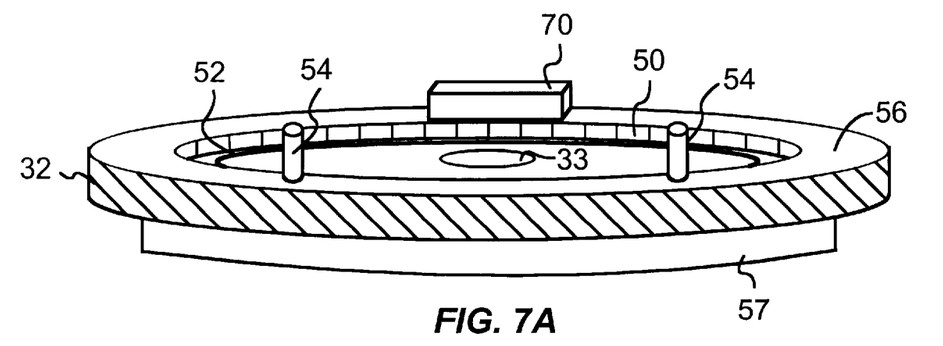
FIG. 7A is a top perspective view of a third embodiment of the invention.
Figure 7B:
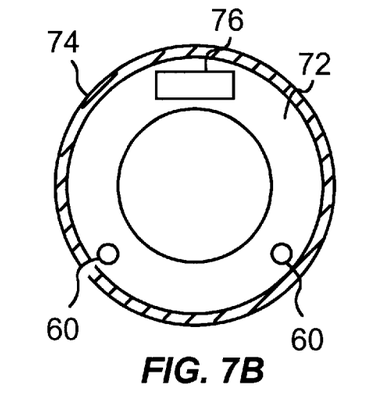
FIG. 7B is a bottom plan view of an annular ring placed on top of the wafer supporting device of FIG. 3A.

FIGS. 6A and 6B show an alternate embodiment of the invention. Instead of pegs 54 and 55 of FIG. 5A, the wafer is fixed in position using a raised ridge 64. An annular ring 66, shown in FIG. 6B, with raised rim 68 on its bottom surface, is placed over the wafer to secure the wafer to disk member 32. Annular ring 66 is similar to annular ring 58 of FIGS. 5C and 5D, but lacks holes 60. Many alternate means for positioning the wafer may be imagined, each with correspondingly shaped rings for securing the wafer to the device. A further possible embodiment is shown in FIG. 7A–B, in which a bar 70 is positioned against the flat portion of the wafer and pegs 54 restrict the wafer position. A corresponding angular ring 72 with a cutout portion 76 to accommodate bar 70 and a raised rim 74 is shown in FIG. 7B.

Figure 8:
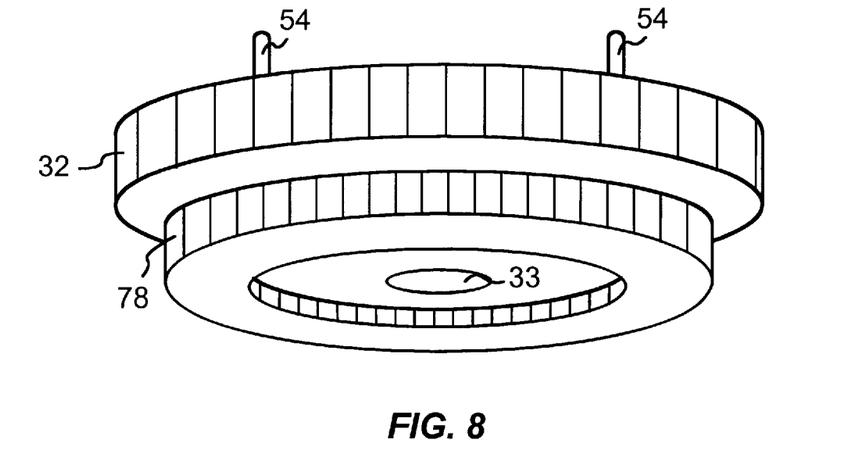
FIG. 8 is a bottom perspective view of a further embodiment of the wafer holding device including a bottom cooling gas recess.

Depending on the structure of the surrounding process equipment, a modified annular protrusion 78, shown in FIG. 8, can have an inner diameter larger than aperture 33 to accommodate flow of a cooling gas.

Figure 9:
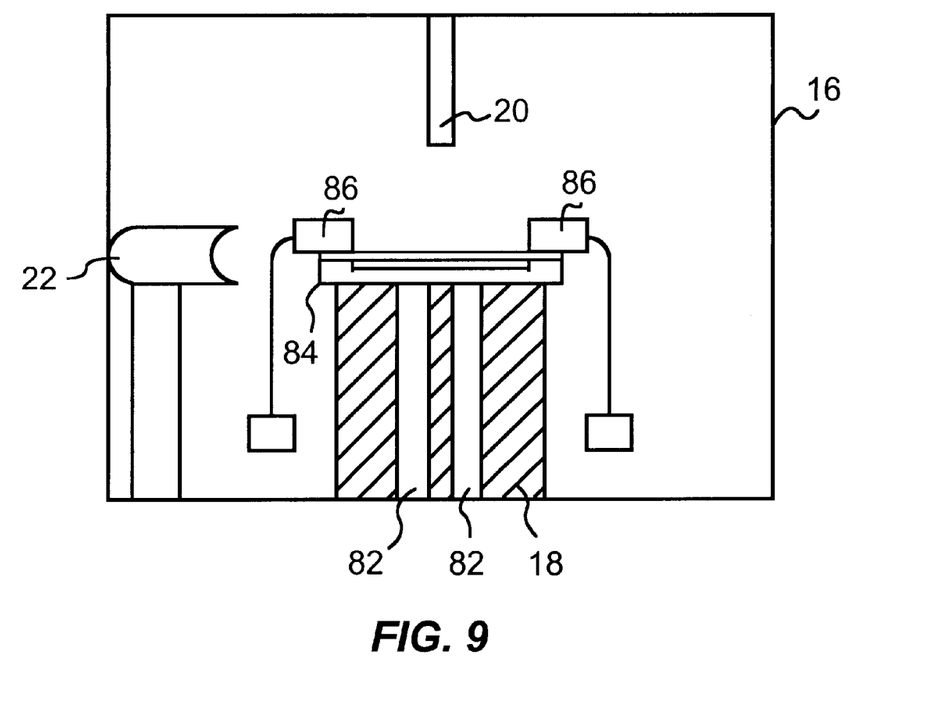
FIG. 9 is a front schematic of a wafer-processing system containing the wafer holding device, using mechanical clamps.
Figure 10:
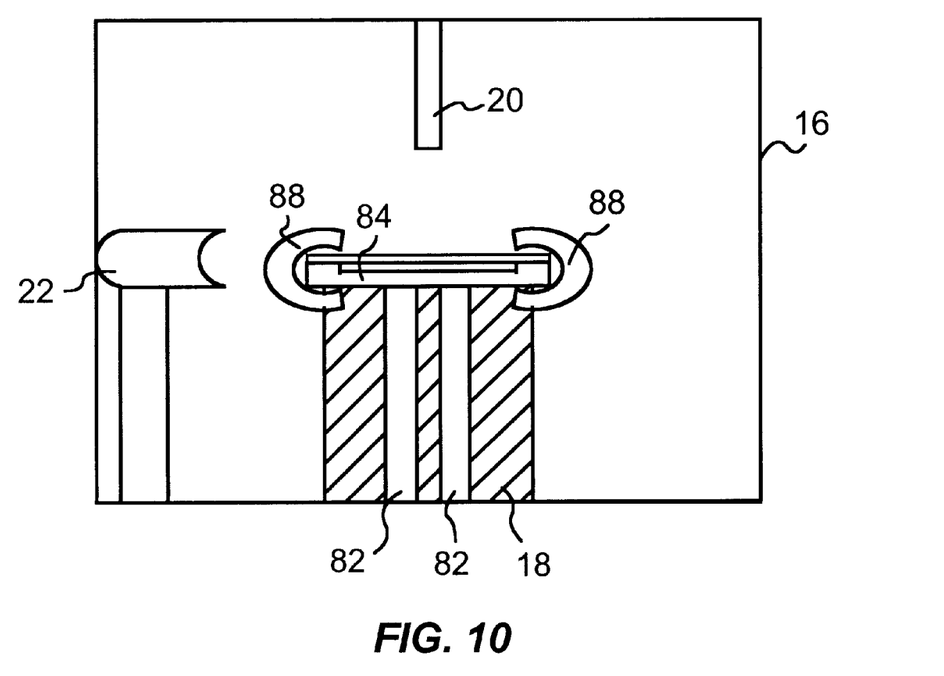
FIG. 10 is a front schematic of a wafer-processing system containing the wafer holding device, using electrostatic clamps.

FIGS. 9 and 10 are front schematics of two possible embodiments of a wafer-processing system incorporating the present invention, a wafer holding device 84. The systems are similar to the prior art system shown in FIG. 2, except that robotic transfer means 22 now hold wafer holding device 84 rather than backing wafer system 11. Process chamber 16, chuck 18, processing tool 20, and robotic transfer means 22 are identical to those used in the prior art system. Also shown in FIGS. 9 and 10 are channels 82 inside chuck 18 for flowing gas to wafer holding device 84.

Two methods are currently used to clamp wafer backing system 11 to chuck 18, namely mechanical and electrostatic. Both methods can be used to clamp wafer holding device 84 to chuck 18. The mechanical method of FIG. 9 uses weight mechanisms 86 to secure wafer holding device 84 to chuck 18. Referring to FIG. 5, weight mechanisms 86 also compress O-ring 52 to maintain an airtight seal between the wafer and wafer holding device 84. When electrostatic clamping is used, clips 88 secure annular ring 58 and the wafer to disk member 32.

It will be clear to one skilled in the art that the above embodiment may be altered in many ways without departing from the scope of the invention. For example, instead of a ring member, the wafer can be secured to the disk member using clips. To support irregularly sized and shaped wafers, the supporting edge can also be irregularly shaped. Accordingly, the scope of the invention should be determined by the following claims and their legal equivalents.

What is claimed is:

1. A wafer holding device for supporting a wafer by a bottom surface of said wafer and transporting said wafer into and out of a wafer processing chamber, said device comprising:

a base member with a top surface, a bottom surface, and a perimeter edge;

a raised supporting edge for supporting said wafer by said bottom surface of said wafer, said supporting edge extending to a constant height in a direction normal to said top surface of said base member and extending continuously around said perimeter edge of said base member, and forming a recession well comprising a portion of said top surface of said base member and an inner wall of said supporting edge;

means for positioning said wafer on said supporting edge;

means for securing said wafer to said supporting edge; and a holding portion on said base member for engaging said wafer holding device with a robotic arm.

2. The wafer holding device of claim 1 wherein said base member has an aperture extending between said top surface and said bottom surface through which a medium can pass to moderate the temperature of said wafer by contacting said bottom surface of said wafer.

3. The wafer holding device of claim 2 wherein said aperture is substantially central to said portion of said top surface of said base member.

4. The wafer holding device of claim 1 wherein said base member is a circular disk member.

5. The wafer holding device of claim 1, further comprising a resilient, deformable material to provide a substantially airtight seal between said wafer holding device and said wafer.

6. The wafer holding device of claim 5 wherein said supporting edge comprises a planar top surface parallel to said top surface of said base member.

7. The wafer holding device of claim 6 wherein said deformable material is an O-ring and said planar top surface of said supporting edge has a groove for receiving said O-ring.

8. The wafer holding device of claim 6 wherein said deformable material is an O-ring placed inside said recession well and continuously contacting said inner wall of said supporting edge.

9. The wafer holding device of claim 1 wherein said means for securing said wafer to said supporting edge comprises a ring member placed over said wafer, said ring member having a substantially central hole.

10. The wafer holding device of claim 9 wherein said ring member further comprises a raised rim depending from the bottom surface of said ring member for fitting around said perimeter edge of said base member.

11. The wafer holding device of claim 9 wherein said means for positioning said wafer on said supporting edge comprises at least three pegs mounted on said supporting edge, at least two of said pegs for contacting a flat portion of the edge of said wafer and the remaining numbers of said pegs for contacting remaining portions of the edge of said wafer, thereby fixing the rotational orientation of said wafer with respect to said wafer holding device; and said ring member has at least three peripheral holes for fitting around said pegs, the number and location of said peripheral holes corresponding to the number and location of said pegs.

12. The wafer holding device of claim 9 wherein said means for positioning said wafer on said supporting edge comprises a continuous raised ridge extending from said supporting edge, said raised ridge in the shape of said wafer for continuously contacting the edge of said wafer.

13. The wafer holding device of claim 9 wherein said means for positioning said wafer on said supporting edge comprises a raised ridge extending from said supporting edge for contacting a flat portion of the edge of said wafer and at least one peg mounted on said supporting edge for contacting a curved portion of the edge of said wafer, thereby fixing the rotational orientation of said wafer with respect to said wafer holding device; and said ring member has peripheral holes through which said raised ridge and said pegs fit when said ring member is placed over said wafer.

14. The wafer holding device of claim 1 wherein said holding portion comprises an annular protrusion depending from said bottom surface of said base member.

15. The wafer holding device of claim 14 wherein the outer diameter of said annular protrusion is equivalent to the diameter of said wafer.

16. The wafer holding device of claim 1 wherein said base member, said supporting edge, and said holding portion are fabricated of a metal selected from the group consisting of aluminum, stainless steel, and copper.

17. The wafer holding device of claim 1 wherein said base member, said supporting edge, said means for positioning said wafer on said supporting edge, said means for securing said wafer to said supporting edge, and said holding portion are sized to hold a standard-sized silicon wafer.

18. A metal reusable wafer holding device for transporting and supporting a standard-sized silicon wafer by a bottom surface of said wafer in a process chamber during very deep to through-wafer etching, said device comprising:

a planar disk member with a diameter between 4 and 8 inches and a thickness between 0.030 and 1 inch;

said disk member having a circular recession well in the top surface of said disk member, said recession well having a depth of between 0.01 and 0.9 inch and a diameter of between 1 and 3.9 inches and a concentric circular aperture with a diameter of between 0.1 and 2 inches, extending between the bottom surface of said recession well and the bottom surface of said disk member, through which a cooling gas can flow to contact said bottom surface of said wafer;

a rubber O-ring with a diameter between 1 and 3.9 inches placed inside said recession well and continuously contacting the wall of said recession well;

means for positioning said wafer on said disk member;

means for securing said wafer to said disk member; and an annular concentric protrusion from said bottom surface of said disk member, sized equivalently to a standard silicon wafer, for engaging a robotic arm designed to transport a silicon wafer into and out of a processing chamber.

19. The wafer holding device of claim 18 wherein said means for positioning said wafer on said disk member comprises four cylindrical pegs with diameters between 0.1 and 0.2 inch and lengths between 0.1 and 1 inch, said pegs fixed perpendicularly to said disk member at a radial distance between 2 and 2.5 inches from the center of said disk member, the first and second of said pegs fixed 120° apart and the third and fourth fixed between 0.5 and 1.5 inches apart from each other and on a chord perpendicular to a radial line 120° from the first and second pegs; and means for attaching said pegs to said disk member.

20. The wafer holding device of claim 19 wherein said means for securing said wafer to said disk member comprises an annular ring with an outer diameter larger than the diameter of said disk member, an inner diameter between 1 and 3 inches, a thickness between 0.01 and 0.06 inches, a rigid raised rim at the circumference of the bottom surface of said annular ring, and four holes for fitting over said pegs, said ring placed on top of said wafer on said disk member.

21. A wafer-processing system comprising:

a sealed, airtight process chamber;

means for creating and maintaining a vacuum within said chamber;

a processing tool;

a chuck within said chamber for holding a silicon wafer, said chuck having channels for flowing gas through;

means for controlling gas flow through said chuck;

a wafer holding device for supporting a wafer during transport onto said chuck and during processing on said chuck, said device having a protrusion similar in size and shape to a standard silicon wafer;

means for removably fixing said wafer and said wafer holding device onto said chuck; and robotic transfer means for transporting said wafer holding device into said chamber and positioning said wafer holding device on said chuck, said transfer means having an arm fitted to hold a standard silicon wafer.

22. The wafer-processing system of claim 21, further comprising means to position said wafer holding device in said arm of said robotic transfer means.

23. The wafer-processing system of claim 21 wherein said wafer holding device further comprises:

a base member with a top surface, a bottom surface, a perimeter edge, and an aperture extending between said top surface and said bottom surface, through which a medium can pass to moderate the temperature of said wafer by contacting said bottom surface of said wafer;

a raised supporting edge for supporting said wafer by a bottom surface of said wafer, said supporting edge extending to a constant height in a direction normal to said top surface of said base member and extending continuously around said perimeter edge of said base member, and forming a recession well comprising a portion of said top surface of said base member and an inner wall of said supporting edge;

means for positioning said wafer on said supporting edge;and means for securing said wafer-to said supporting edge.

24. The wafer-processing system of claim 21 wherein said means for removably fixing said wafer and said wafer holding device onto said chuck comprises:

means for electrostatically clamping said wafer holding device onto said chuck; and adjustable means for fixing said wafer onto said wafer holding device.

25. The wafer-processing system of claim 24 wherein said adjustable means for fixing said wafer onto said wafer holding device comprises spring-loaded clips.

26. The wafer-processing system of claim 21 wherein said means for removably fixing said wafer and said wafer holding device onto said chuck comprises weight mechanisms placed on top of said wafer holding device.

* * * * *